United States Patent [19]

Lee et al.

[11] Patent Number: 5,674,770

[45] Date of Patent: Oct. 7, 1997

[54] METHOD OF FABRICATING AN SRAM DEVICE WITH A SELF-ALIGNED THIN FILM TRANSISTOR STRUCTURE

[75] Inventors: Jin-Yuan Lee, Hsin-Chu; Shou-Gwo Wuu, Chu-Tong, both of Taiwan

[73] Assignee: Taiwan Semiconductor Manufacturing Company, Ltd., Hsin-Chu, Taiwan

[21] Appl. No.: 721,664

[22] Filed: Sep. 27, 1996

[51] Int. Cl.[6] .............................. H01L 21/70; H01L 27/00
[52] U.S. Cl. .................................................. 437/52; 257/903
[58] Field of Search ...................................... 437/52; 257/903

[56] References Cited

U.S. PATENT DOCUMENTS

| | | | |
|---|---|---|---|
| 5,194,749 | 3/1993 | Meguro et al. | 257/69 |
| 5,385,854 | 1/1995 | Batra et al. | 437/41 |
| 5,483,104 | 1/1996 | Godinho et al. | 257/758 |
| 5,485,420 | 1/1996 | Lage et al. | 365/154 |
| 5,516,715 | 5/1996 | Itabashi et al. | 437/52 |

Primary Examiner—Charles L. Bowers, Jr.
Assistant Examiner—Lynne A. Gurley
Attorney, Agent, or Firm—George O. Saile; Stephen B. Ackerman

[57] ABSTRACT

A process for fabricating SRAM cells, including MOSFET devices, as well as thin film transistor structures, has been developed. The process features self-alignment of the MOSFET polysilicon gate structure to the polysilicon gate structure of the thin film transistor. Self-alignment is accomplished via a photolithographic and dry etching patterning procedure, applied to a combination of polysilicon, and insulator layers, resulting in the desired polysilicon gate structures for both the MOSFET and thin film transistor devices.

24 Claims, 5 Drawing Sheets

METHOD OF FABRICATING AN SRAM DEVICE WITH A SELF-ALIGNED THIN FILM TRANSISTOR STRUCTURE

BACKGROUND OF THE INVENTION (1) Field of the Invention

The present invention relates to a process for fabricating semiconductor devices, and more specifically to a process used to fabricate thin film transistor, (TFT), load type, static random access memory, (SRAM), device.

(2) Description of the Prior Art

High resistance loads are used in SRAM designs to reduce the power consumption experienced with the increased density of memory cells. However with the use of increasing memory cells per chip, the values of the high resistance loads must also be increased. The higher resistance loads, in turn, result in difficulties, when attempting to reliably maintain the desired characteristics of other devices in the SRAM cell. The TFT load type SRAM design, which uses the TFT as the load, does not experience the instability problems associated with the high resistance load counterparts, previously discussed. Thus the TFT load type SRAM is now being extensively used in place of high resistance load type SRAMs.

The complexity of integrating TFT structures in an SRAM design has to be considered, in terms of fabrication complexity and cost. The additional processing steps used to produce a TFT structure, in addition to the fabrication steps used to create the conventional metal oxide semiconductor field effect transistors, (MOSFET), devices, also used in the SRAM configuration, can result in a costly and complex integrated SRAM process. These factors, fabrication cost and complexity, have been addressed in this invention. A fabrication process for a TFT load type SRAM, has been developed, in which the polysilicon gate structure used in the TFT component, is self aligned to the polysilicon gate structure used for the conventional MOSFETs of the SRAM design, thus resulting in density enhancements as well as reductions in process complexity via the use of process steps shared by both TFT and MOSFET components. Prior art such as Itabashi, et al, in U.S. Pat. No. 5,516,715, describe the development of SRAM devices with self-aligned elements and contacts, however that prior art does not use self-alignment of TFT and MOSFET polysilicon gates.

SUMMARY OF THE INVENTION

It is an object of this invention to create a TFT load type SRAM device, comprised of TFT and MOSFET elements.

It is another object of this invention to provide a process for forming a TFT, comprised of a polysilicon gate structure, a channel region, and source and drain regions.

It is still another object of this invention to provide a process for forming MOSFET device structures, comprised of a polysilicon gate structure, a channel region and source and drain regions.

It is yet another object of this invention to use a buried contact region to electrically connect the TFT and MOSFET structures.

It is still yet another object of this invention to self-align the polysilicon gate of the SRAM, TFT structure, to a polysilicon gate of SRAM, MOSFET structures.

In accordance with the present invention a process for forming a TFT load type SRAM device, in which the polysilicon gate of the TFT structure is self-aligned to the polysilicon gate structure of the MOSFET structure, is described. After creation of field oxide regions a first gate insulator layer, to be used as the gate insulator of subsequent MOSFET structures is thermally grown, followed by the deposition of a polysilicon layer, to be used as a split polysilicon layer. An opening in the split polysilicon layer, and the underlying first gate insulator layer is made, allowing a buried contact region to be created in the semiconductor substrate, via ion implantation procedures. A second polysilicon layer is deposited on the split polysilicon layer, as well as on the buried contact region. A second gate insulator layer, to be used as the gate insulator of the TFT structure, is thermally grown on the surface of the second polysilicon layer. Openings in the second gate insulator, to expose the second polysilicon layer, are made in a region to be used for contact to the TFT structure, as well as to allow removal of the second gate insulator layer, from the surface of the second polysilicon layer, in regions to be used for access and peripheral MOSFET devices. A thin polysilicon layer is next deposited and annealed, to create a thin recrystallized silicon layer, overlying the second gate insulator layer, and overlying the second polysilicon layer in regions to be used for TFT contacts, while also overlying MOSFET polysilicon gate structures. Ion implantation procedures are next employed to create source and drain regions for the TFT structure, followed by the deposition of an insulator layer. Patterning of the insulator layer, the thin recrystallized silicon layer, the second polysilicon layer, and the split polysilicon layer, are performed to create a TFT, polysilicon gate structure, self-aligned to the created MOSFET polysilicon gate structure. Lightly doped source and drain regions, and insulator sidewall spacers are formed for the MOSFET device structure, followed by the formation of the heavily doped, MOSFET source and drain regions, connecting to the TFT structure via the buried contact region.

BRIEF DESCRIPTION OF THE DRAWINGS

The object and other advantages of this invention are best described in the preferred embodiments with reference to the drawings that include.

DESCRIPTION OF THE PREFERRED EMBODIMENTS

Figure 1:
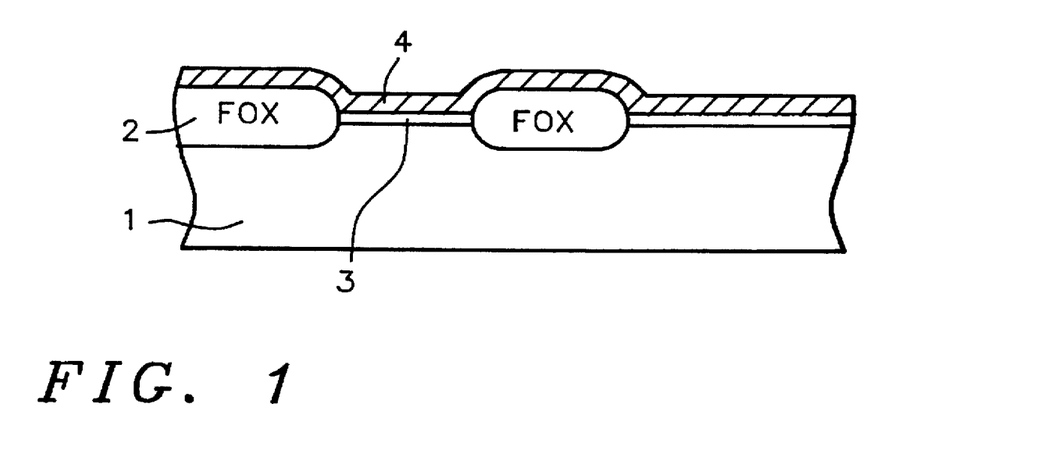
FIGS. 1–9, which schematically, in cross-sectional style, illustrate the key stages of fabrication used to create a TFT load type SRAM device, featuring a TFT polysilicon gate structure, self-aligned to a polysilicon gate structure of a MOSFET device.

The method of creating a TFT load type SRAM device, using a fabrication sequence which allows self-alignment between the polysilicon gate structure of the TFT, and the polysilicon gate structure of the SRAM MOSFET devices, will now be described in detail. Although the MOSFET devices used in the SRAM configuration can be both P channel, (PFET), as well as N channel, (NFET), structures, only the NFET devices will be described in this invention. A P type, semiconductor substrate, 1, composed of single crystalline silicon with a <100> orientation, is used and shown schematically in FIG. 1. Thick field oxide regions, 2, (FOX), are formed for isolation purposes. Briefly the method used to create FOX regions, 2, is to initially create the desired pattern in an composite oxidation resistant mask, composed of an overlying silicon nitride layer and an underlying silicon oxide layer. A thermal oxidation is performed in an oxygen-steam ambient, at a temperature between about 850° to 1050° C., forming a FOX region, 2, at a thickness between about 3000 to 6000 Angstroms, in areas not covered by the composite oxidation resistant mask. After removal of the composite oxidation resistant mask, using hot phosphoric acid for silicon nitride, and a buffered hydrofluoric acid solution for the underlying silicon oxide layer, a first gate insulator layer, 3, of silicon dioxide, is thermally grown in an oxygen-steam ambient, at a temperature between about 750° to 900° C., to a thickness between about 40 to 110 Angstroms. First gate insulator layer, 3, will be used for the gate insulator layer for subsequent MOSFET structures. Next a first layer of polysilicon, 4, is deposited using low pressure chemical vapor deposition, (LPCVD), procedures, at a temperature between about 560° to 630° C., to a thickness between about 300 to 1000 Angstroms, including in situ doping procedures, via incorporation of arsine or phosphine to a silane ambient. This polysilicon silicon layer is also referred to as a split polysilicon layer, subsequently combining with an overlying polysilicon layer to furnish the material needed for the polysilicon gate structure of the MOSFET device, as well as the material needed for the substrate of the TFT structure. This is shown schematically in FIG. 1.

Figure 2:
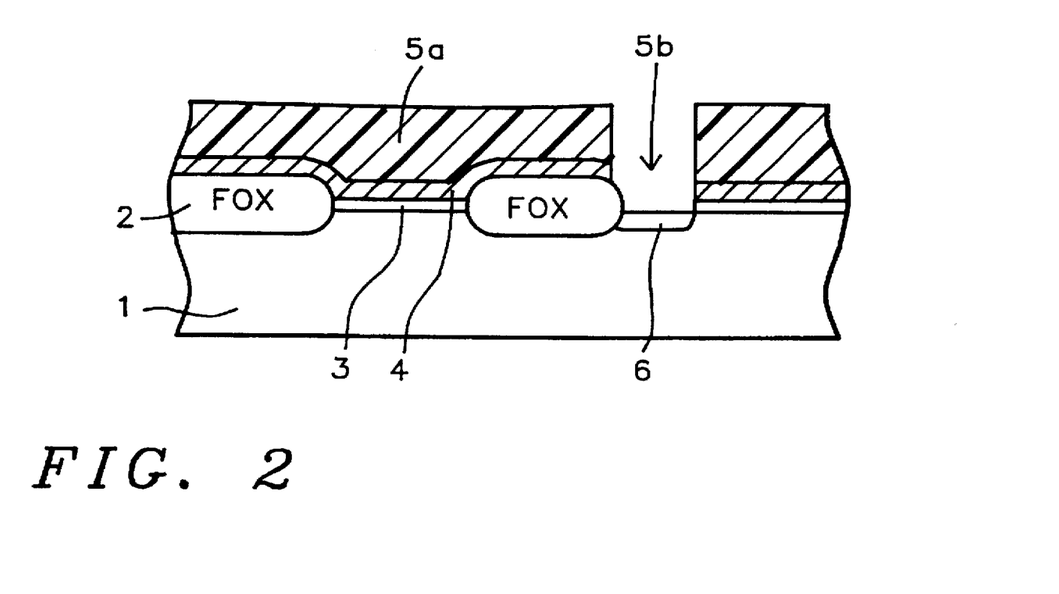

A photoresist layer, 5a, is next applied and patterned to allow opening, 5b, to be formed in the split polysilicon layer, 4, and first gate insulator layer, 3, via anisotropic, reactive ion etching, (RIE), using $Cl_2$ as an etchant for split polysilicon layer, 4, and $CHF_3$ as an etchant for gate insulator layer, 3. A buried contact region, 6, is next created via an ion implantation of phosphorous, at an energy between about 20 to 35 KeV, at a dose between about 1E15 to 1E16 atoms/$cm^2$. This is schematically shown in FIG. 2. The buried contact region, 6, will ultimately allow electrical connection between a source and drain region of a MOSFET device, and a source and drain region of a TFT structure. Removal of photoresist layer, 5a, is accomplished via plasma oxygen ashing and careful wet cleans. Buried contact region, 6, can also be subsequently created by outdiffusion from a doped, overlying polysilicon layer, 7.

Figure 3:
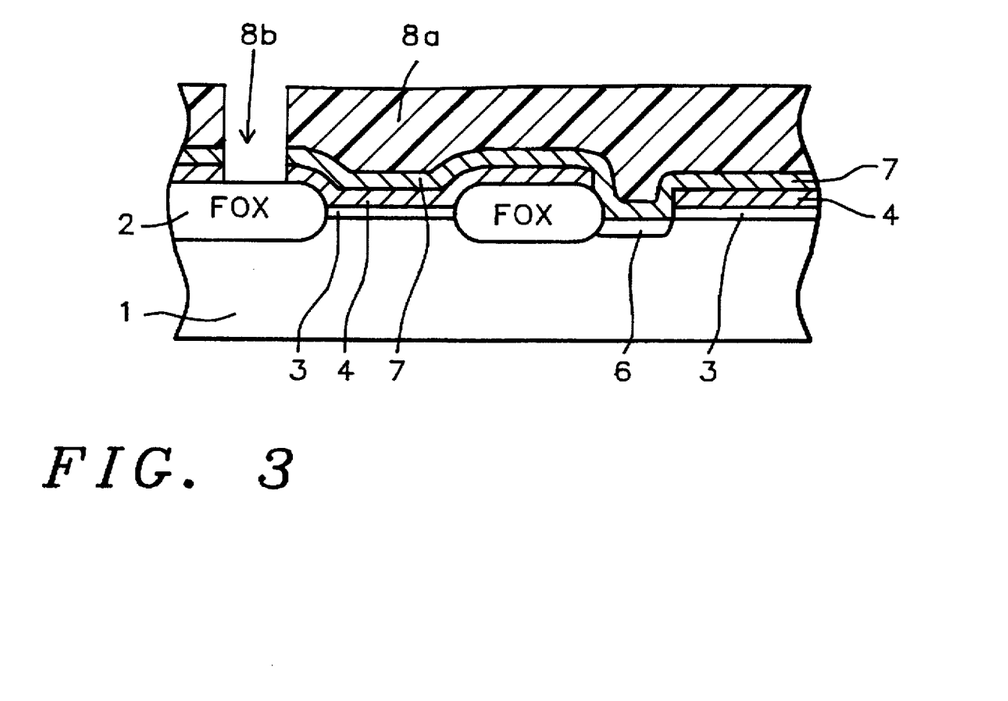

A second polysilicon layer, 7, is deposited via LPCVD procedures, at a temperature between about 560° to 630° C., to a thickness between about 1000 to 3000 Angstroms. Polysilicon layer, 7, can either be deposited via in situ doping procedures, by the addition of either arsine or phosphine to a silane ambient, or polysilicon layer, 7, can be grown intrinsically and doped via ion implantation of either arsenic or phosphorous, at an energy between about 25 to 50 KeV, at a dose between about 1E14 to 1E16 atoms/$cm^2$. If buried contact region, 6, had not been formed via an ion implantation procedure, outdiffusion from polysilicon layer, 7, would have created buried contact region, 6. A photoresist layer, 8a, is applied and patterned, and used as a mask to allow opening, 8b, to be created in second polysilicon layer, 7, and split polysilicon layer, 4, via anisotropic, RIE procedures, using $Cl_2$ as an etchant. This is schematically illustrated in FIG. 3. Photoresist layer, 8a, is removed using plasma oxygen ashing and careful wet cleans.

Figure 4:
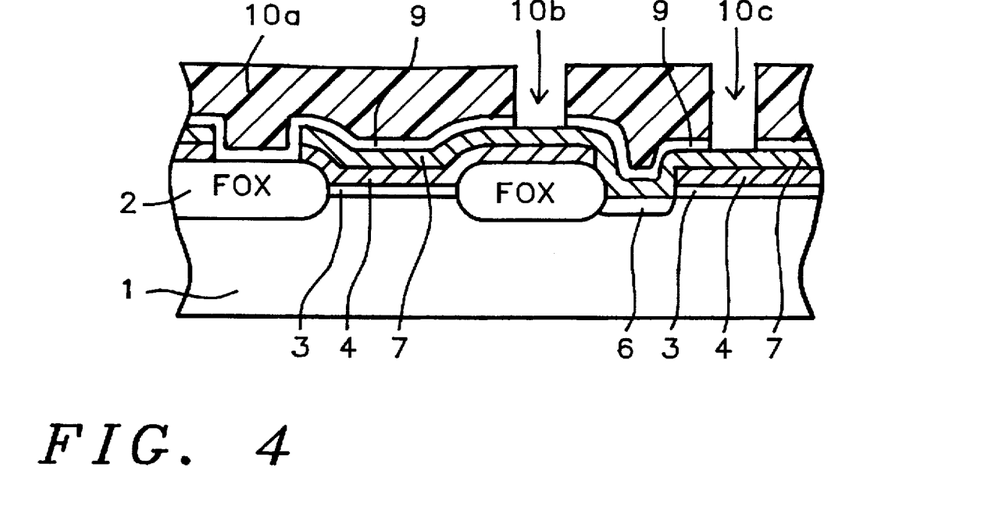

A second gate insulator layer, 9, of silicon oxide, is next deposited using LPCVD procedures, at a temperature between about 700° to 800° C., to a thickness between about 200 to 800 Angstroms. Second gate insulator layer, 9, is shown schematically in FIG. 4, overlying second polysilicon layer, 7. Second gate insulator layer, 9, will serve as the gate insulator layer for the TFT structure. Another photoresist layer, 10a, is now applied and patterned, creating openings 10b and 10c, in photoresist layer, 10a, and allowing the removal of second gate insulator layer, 9, from the surface of second polysilicon layer, 7, via RIE procedures, using $CHF_3$ as an etchant. This is shown schematically in FIG. 4. The removal of second gate insulator layer, 9, in region, 10b, will allow subsequent contact to the TFT structure to be made, while the removal of second gate insulator layer, 9, in region, 10c, will allow a polysilicon gate structure to be subsequently formed for MOSFET structures.

Figure 5:
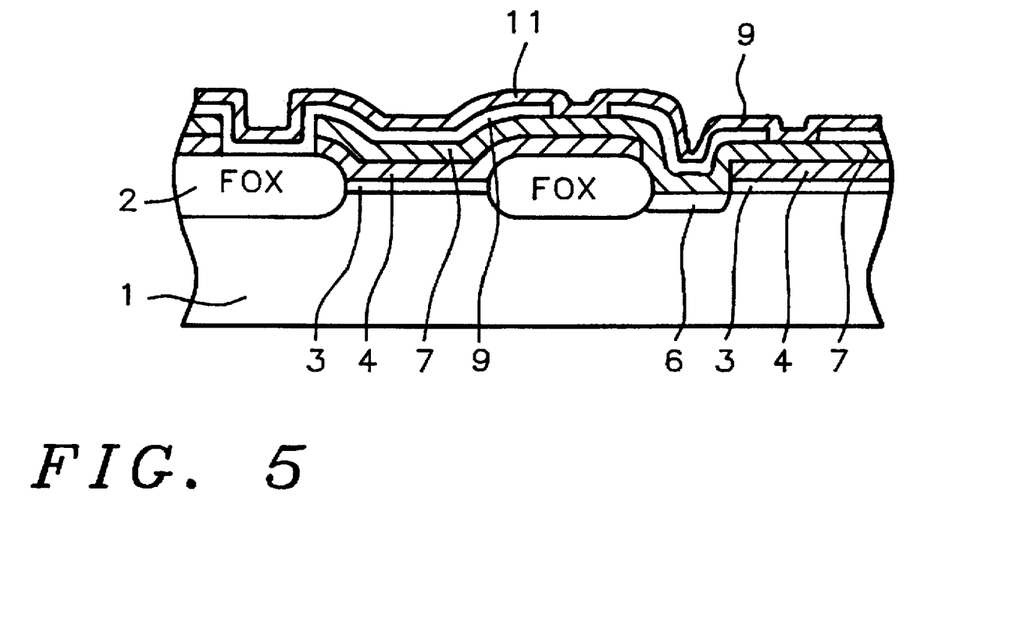
Figure 6:
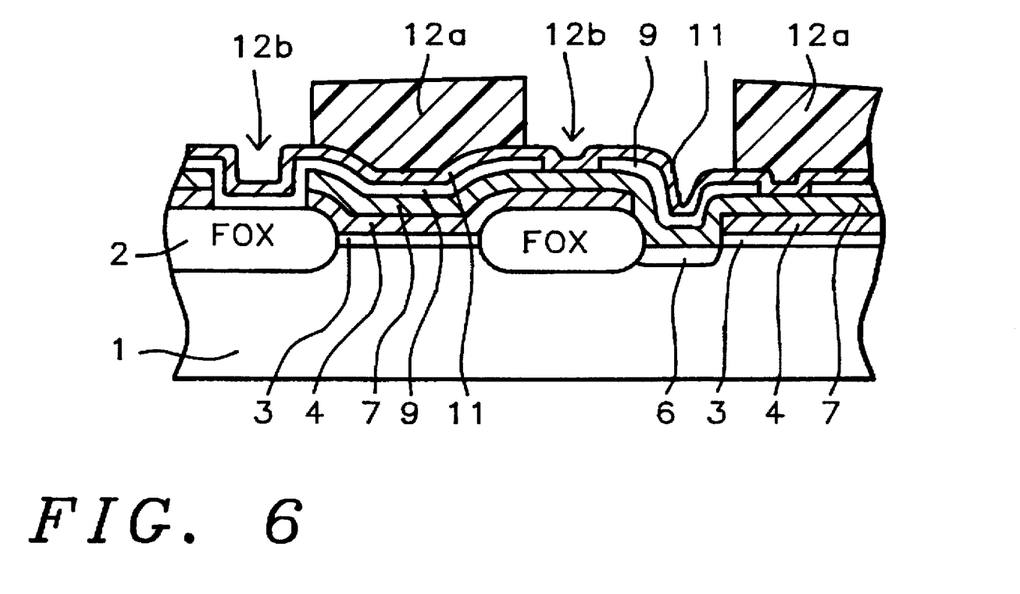

After removal of photoresist layer, 10a, via plasma oxygen ashing and careful wet cleans, a thin, third silicon layer, 11, is deposited via LPCVD procedures, at a temperature between about 460° to 550° C., to a thickness between about 200 to 1000 Angstroms. This as-deposited silicon layer, 11, is an amorphous silicon layer. An anneal procedure is next performed, at a temperature between about 550° to 650° C., in an $N_2$ ambient, for purposes of recrystallizing thin, third silicon layer, 11, to thin, third polysilicon layer, 11. This is shown schematically in FIG. 5. Another photoresist layer, 12a, is applied and patterned, allowing source and drain regions, for the TFT structure, to be created in the underlying layers of thin, third polysilicon layer, 11, second polysilicon layer, 7, and split polysilicon layer, 4, through openings, 12b, in photoresist layer, 12a. The TFT source and drain areas are created via ion implantation of $BF_2$, at a energy between about 15 to 40 KeV, and at a dose between about 1E14 to 1E16 atoms/$cm^2$. A PMOS type, TFT, is used in this invention and illustrated schematically in FIG. 6. Removal of photoresist layer, 12a, is again accomplished via plasma oxygen ashing and careful wet cleans.

Figure 7:
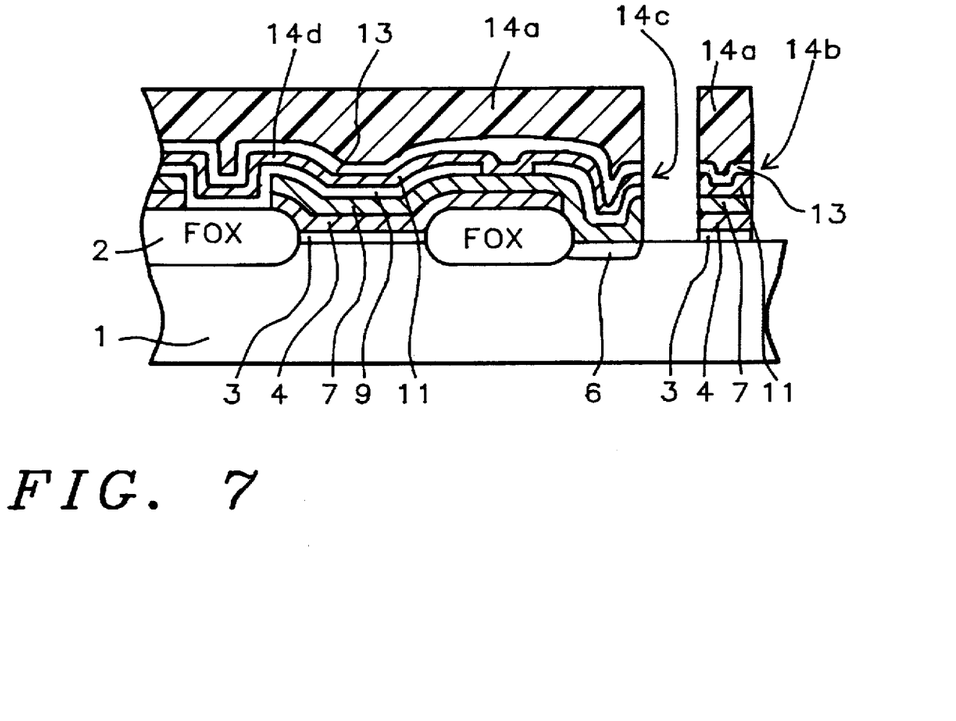

The critical feature of this invention, the self-alignment between the TFT, and the MOSFET, polysilicon gate structures, is next performed. First an insulator layer, 13, is deposited using either LPCVD procedures, at a temperature between about 700° to 800° C., or plasma enhanced chemical vapor deposition, (PECVD), procedures, at a temperature between about 300° to 450° C., to a thickness between about 1000 to 3000 Angstroms. Insulator layer, 13, will protect the TFT structure from subsequent MOSFET, source and drain ion implantation procedures. A photoresist layer, 14a, is applied and patterned to create the photoresist mask needed for polysilicon gate structure, and polysilicon contact structure, patterning. RIE procedures, using $CHF_3$ as an etchant for insulator layer, 13, second gate insulator layer, 9, and first gate insulator layer, 4, while using $Cl_2$ as an etchant for thin, polysilicon layer, 13, second polysilicon layer, 7, and split polysilicon layer, 4, create MOSFET polysilicon gate structure, 14b, TFT polysilicon gate structure, 14d, and polysilicon contact structure, 14c, schematically shown in FIG. 7. The TFT and MOSFET polysilicon gate structures formed during this RIE procedure, using the same photo pattern, are now self-aligned to each other. Photoresist layer, 14a, is removed using plasma oxygen ashing, and careful wet cleans.

Figure 8:
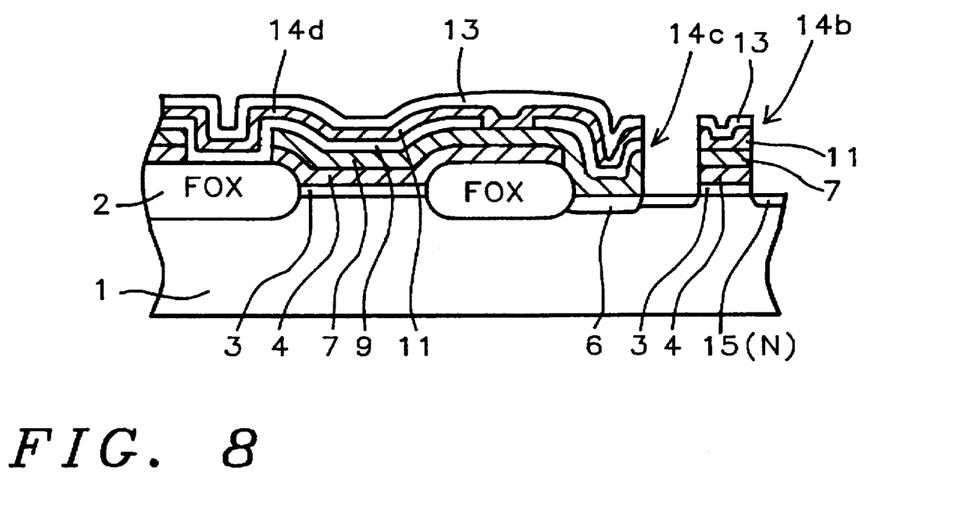
Figure 9:
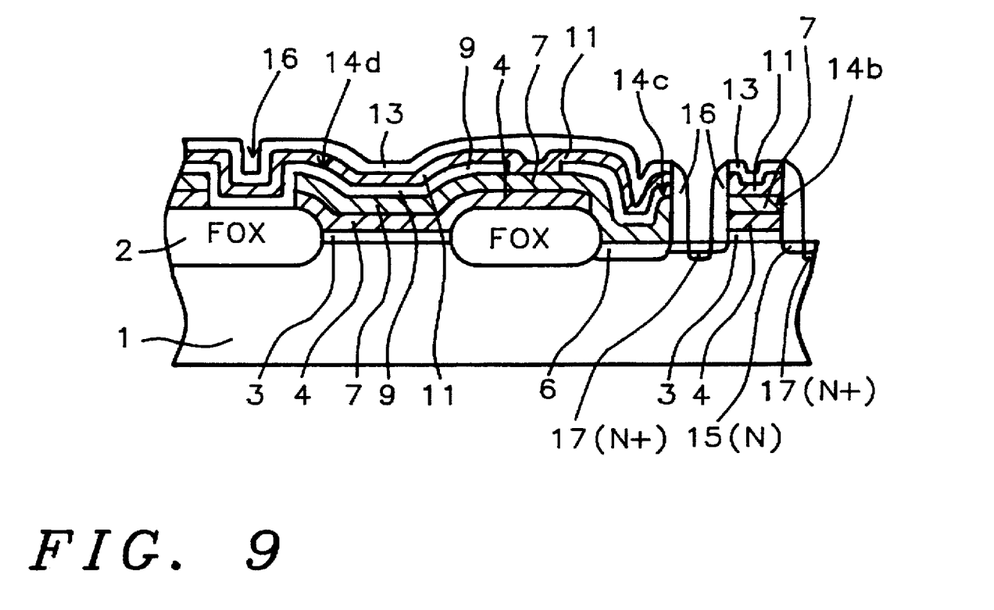

FIGS. 8–9, schematically describe the processing used to create source and drain regions for the MOSFET structure. A lightly doped source and drain region, 15, is created via an ion implantation of phosphorous, at an energy between about 20 to 40 KeV, at a dose between about 1E12 to 1E14 atoms/$cm^2$. This is shown in FIG. 8. Next an insulator layer, of silicon oxide, is deposited using either LPCVD or PECVD procedures, at a temperature between about 700° to 800° C., to a thickness between about 600 to 2500 Angstroms. Anisotropic, RIE procedures, using $CHF_2$ as an etchant, are used to create insulator spacers, 16, on the sides of MOSFET polysilicon gate structure, 14b, as well as on the exposed sides of polysilicon contact structure, 14c. Heavily doped source and drain regions, 17, are next formed for the MOSFET structure, via ion implantation of arsenic, at an energy between about 25 to 40 KeV, at a dose between about 1E14 to 1E16 atoms/cm$^2$. This is shown schematically in FIG. 9. FIG. 9, shows that electrical connection between the source and drain regions of the MOSFET structure, and the TFT structure, is established via buried contact region, 6.

This invention, although described and shown using an NFET device, can also be achieved for a PFET device. In most SRAM designs, both NFET and PFET devices are used. This invention can easily be applied to those designs, using both NFET and PFET, MOSFET devices, and self aligned to TFT structure.

While this invention has been particularly shown and described with reference to the preferred embodiments thereof, it will be understood by those skilled in the art that various changes in form and details may be made without departing from the spirit and scope of this invention.

What is claimed is:

1. A method for fabricating an SRAM cell, with MOSFET devices and a thin film transistor structure, on a semiconductor substrate, comprising the steps of:

forming field oxide regions in said semiconductor substrate;

growing a first gate insulator layer, in areas of said semiconductor substrate not covered by said field oxide regions, to be used as the gate insulator layer for one of said MOSFET devices;

depositing a first polysilicon layer on said first gate insulator layer, and on said field oxide regions;

forming a first hole opening, in said first polysilicon layer, and in said first gate insulator layer, exposing said semiconductor substrate;

ion implanting a first conductivity imparting dopant into a region of said semiconductor substrate, exposed in said first hole opening, to create a buried contact region;

depositing a second polysilicon layer on said first polysilicon layer, and on said buried contact region;

doping said second polysilicon layer;

forming a second hole opening, in said second polysilicon layer, and in said first polysilicon layer, exposing a first field oxide region;

depositing a second gate insulator layer on said second polysilicon layer, and on said first field oxide region, exposed in said second hole opening, to be used as the gate insulator for the thin film transistor structure;

forming third hole openings in said second gate insulator layer, exposing said second polysilicon layer, in a first area, in which said second polysilicon layer overlies said first polysilicon layer, and a second field oxide region, where said first area will be used to allow subsequent contact to said thin film transistor structure, while also removing said second gate insulator layer from the top surface of said second polysilicon layer, in a second area, in which said second polysilicon layer overlies said first polysilicon layer, and said first gate insulator layer, exposing said second area that will be used for a subsequent MOSFET polysilicon gate structure;

depositing a third silicon layer on said second gate insulator layer, and on said first area, and said second area of said second polysilicon layer, exposed in said third hole openings;

annealing to recrystallize said third silicon layer, to form a third polysilicon layer;

ion implanting a second conductivity imparting dopant into regions of said third polysilicon layer, to create source and drain regions for said thin film transistor structure;

depositing a cap insulator layer on said third polysilicon layer;

patterning said cap insulator layer, said third polysilicon layer, said second polysilicon layer, and said first polysilicon layer, to form a polysilicon gate structure, on said first gate insulator layer, for said MOSFET device, patterning said cap insulator layer, said third polysilicon layer, to form a polysilicon gate structure, on said second gate insulator layer, for said thin film transistor, and patterning said cap insulator layer, said third polysilicon layer, said second gate insulator layer, and said second polysilicon layer, to form a polysilicon contact structure to said buried contact region;

ion implanting a third conductivity imparting dopant into a region of said semiconductor substrate, not covered by said MOSFET polysilicon gate structure, not covered by said thin film transistor polysilicon gate structure, and not covered by said polysilicon contact structure, to form lightly doped source and drain regions for said MOSFET device;

forming insulator spacers on the sides of said MOSFET polysilicon gate structure, on the sides of said thin film transistor polysilicon gate structure, and on the sides of said polysilicon contact structure; and ion implanting a fourth conductivity imparting dopant into a region of said semiconductor substrate, not covered by said MOSFET polysilicon gate structure, not covered by said thin film transistor polysilicon gate structure, not covered by said polysilicon contact structure, and not covered by said insulator spacers, to form heavily doped source and drain regions for said MOSFET device.

2. The method of claim 1, wherein said first gate insulator layer is silicon dioxide, thermally grown in an oxygen-steam ambient, at a temperature between about 750° to 900° C., to a thickness between about 40 to 110 Angstroms.

3. The method of claim 1, wherein said first polysilicon layer is deposited using LPCVD procedures, at a temperature between about 560° to 630° C., to a thickness between about 300 to 1000 Angstroms.

4. The method of claim 1, wherein said first conductivity imparting dopant, used to create said buried contact region, is phosphorous, ion implanted at an energy between about 20 to 35 KeV, at a dose between about 1E15 to 1E16 atoms/cm$^2$.

5. The method of claim 1, wherein said second polysilicon layer is deposited using LPCVD procedures, at a temperature between about 560° to 630° C., to a thickness between about 1000 to 3000 Angstroms.

6. The method of claim 1, wherein said second gate insulator layer is silicon oxide, deposited using LPCVD procedures, at a temperature between about 700° to 800° C., to a thickness between about 200 to 800 Angstroms.

7. The method of claim 1, wherein said third silicon layer is deposited using LPCVD procedures, at a temperature between about 460° to 550° C., to a thickness between about 200 to 1000 Angstroms.

8. The method of claim 1, wherein re-crystallization of said third silicon layer, to form said third polysilicon layer, is performed via annealing at a temperature between about 550° to 650° C., in an N$_2$ ambient.

9. The method of claim 1, wherein said second conductivity imparting dopant, used to create said source and drain region for said thin film transistor structure, is BF$_2$, ion implanted at an energy between about 15 to 40 KeV, at a dose between about 1E14 to 1E16 atoms/cm$^2$.

10. The method of claim 1, wherein said MOSFET polysilicon gate structure is created via RIE procedures, using CHF$_3$ as an etchant for said cap insulator, and using Cl$_2$ as an etchant for said third polysilicon layer, for said second polysilicon layer, and for said first polysilicon layer.

11. The method of claim 1, wherein said thin film transistor polysilicon gate structure is created via RIE procedures using CHF$_3$ as an etchant for said cap insulator layer, and using Cl$_2$ as an etchant for said third polysilicon layer.

12. The method of claim 1, wherein said polysilicon contact structure is created via RIE procedures, using CHF$_3$ as an etchant for said cap insulator layer, and for said second gate insulator layer, and using Cl$_2$ as an etchant for said third polysilicon layer, and for said second polysilicon layer.

13. A method for fabricating an SRAM cell, on a semiconductor substrate, using a MOSFET polysilicon gate structure, self-aligned to a thin film transistor polysilicon gate structure, comprising the steps of:

forming field oxide regions in said semiconductor substrate;

growing a MOSFET gate insulator layer, on areas of said semiconductor substrate, not covered by said field oxide regions;

depositing a split polysilicon layer on said MOSFET gate insulator layer and on said field oxide regions;

forming a first hole opening, in said split polysilicon layer and in said MOSFET gate insulator layer, exposing a region of said semiconductor substrate;

ion implanting a first conductivity imparting dopant into said region of said semiconductor substrate, exposed in said first hole opening, to create a buried contact region;

depositing a second polysilicon layer on said split polysilicon layer, and on said buried contact region;

doping said second polysilicon layer;

forming a second hole opening in said second polysilicon layer, and in said split polysilicon layer, exposing an area of a first field oxide region;

depositing a thin film transistor gate insulator layer on said second polysilicon layer, and on said area of said first field oxide region, exposed in said second hole opening;

forming third hole openings in said thin film transistor gate insulator layer, exposing said second polysilicon layer, in a first area, in which said second polysilicon layer overlies said split polysilicon layer, and overlies a second field oxide region, with said first area to be used for subsequent contact to said thin film transistor polysilicon gate structure, while also removing said thin film transistor gate insulator layer from the top surface of said second polysilicon layer, in a second area, in which said second polysilicon layer overlies said split polysilicon layer, and said MOSFET gate insulator layer, with said second area to be used for subsequent said MOSFET polysilicon gate structure;

depositing a third silicon layer on said thin film transistor gate insulator layer, and on said second polysilicon layer, exposed in said third hole openings;

annealing said third silicon layer to recrystallize said third silicon layer to a third polysilicon layer;

creating source and drain regions for said thin film transistor polysilicon gate structure, by ion implanting a second conductivity imparting dopant into regions of said third polysilicon layer;

depositing a cap insulator layer on said third polysilicon layer;

patterning said cap insulator layer, said third polysilicon layer, said second polysilicon layer, and said split polysilicon layer, to form said MOSFET polysilicon gate structure on said MOSFET gate insulator layer, and patterning said cap insulator layer, and said third polysilicon layer, to form a thin film transistor polysilicon gate structure, on said thin film transistor gate insulator layer, self-aligned to said MOSFET polysilicon gate structure, while also patterning said cap insulator layer, said third polysilicon layer, said thin film transistor gate insulator layer, and said second polysilicon layer, to form a polysilicon contact structure to said buried contact region;

ion implanting a third conductivity imparting dopant into a region of said semiconductor substrate not covered by said thin film transistor polysilicon gate structure, not covered by said MOSFET polysilicon gate structure, and not covered by said polysilicon contact structure, to form MOSFET lightly doped source and drain regions;

forming insulator spacers on the sides of said MOSFET polysilicon gate structure, on the sides of said thin film transistor polysilicon gate structure, and on the sides of said polysilicon contact structure; and ion implanting a fourth conductivity imparting dopant into a region of said semiconductor substrate, not covered by said MOSFET polysilicon gate structure, not covered by said thin film transistor polysilicon gate structure, not covered by said polysilicon contact structure, and not covered by said insulator spacers, to form MOSFET heavily doped source and drain regions.

14. The method of claim 13, wherein said MOSFET gate insulator layer is silicon dioxide, thermally grown in an oxygen-steam ambient at a temperature between about 750° to 900° C., to a thickness between about 40 to 110 Angstroms.

15. The method of claim 13, wherein said split polysilicon layer is deposited using LPCVD procedures, at a temperature between about 560° to 630° C., to a thickness between about 300 to 1000 Angstroms.

16. The method of claim 13, wherein said first conductivity imparting dopant, used to create said buried contact region, is phosphorous, ion implanted at an energy between about 20 to 35 KeV, at a dose between about 1E15 to 1E16 atoms/cm$^2$.

17. The method of claim 13, wherein said second polysilicon layer is deposited using LPCVD procedures, at a temperature between about 560° to 630° C., to a thickness between about 1000 to 3000 Angstroms.

18. The method of claim 13, wherein said thin film transistor gate insulator layer is deposited using LPCVD procedures, at a temperature between about 700° to 800° C., to a thickness between about 200 to 800 Angstroms.

19. The method of claim 13, wherein said third silicon layer is deposited using LPCVD procedures, at a temperature between about 460° to 550° C., to a thickness between about 200 to 1000 Angstroms.

20. The method of claim 13, wherein re-crystallization of said third silicon layer, to form said third polysilicon layer, is performed at a temperature between about 550° to 650° C., in an N$_2$ ambient.

21. The method of claim 13, wherein said second conductivity imparting dopant, used to create said source and drain regions for said thin film transistor polysilicon gate structure, is BF$_2$, ion implanted at an energy between about 15 to 40 KeV, at a dose between about 1E14 to 1E16 atoms/cm$^2$.

22. The method of claim 13, wherein said MOSFET polysilicon gate structure is created via RIE procedures using CHF$_3$ as an etchant for said cap insulator layer, and using $Cl_2$ as an etchant for said third polysilicon layer, for said second polysilicon layer, and for said split polysilicon layer.

23. The method of claim 13, wherein said thin film transistor polysilicon gate structure is created via RIE procedures using $CHF_3$ as an etchant for said cap insulator layer, and using $Cl_2$ as an etchant for said third polysilicon layer.

24. The method of claim 13, wherein said polysilicon contact structure, to said buried contact region, is created via RIE procedures using $CHF_3$ as an etchant for said cap insulator layer, and for said thin film transistor gate insulator layer, while using $Cl_2$ as an etchant for said third polysilicon layer and for said second polysilicon layer.

* * * * *